(12) United States Patent
Mori

(10) Patent No.: US 10,948,545 B2
(45) Date of Patent: Mar. 16, 2021

(54) RESIDUAL QUANTITY MEASURING DEVICE, BATTERY PACK, ELECTRIC POWER TOOL, ELECTRIC AIRCRAFT, ELECTRIC VEHICLE, AND POWER SUPPLY DEVICE

(71) Applicant: MURATA MANUFACTURING CO., LTD., Kyoto (JP)

(72) Inventor: Yasushi Mori, Fukushima (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 328 days.

(21) Appl. No.: 15/919,627

(22) Filed: Mar. 13, 2018

(65) Prior Publication Data

US 2018/0203069 A1 Jul. 19, 2018

Related U.S. Application Data

(63) Continuation of application No. PCT/JP2016/003861, filed on Aug. 24, 2016.

(30) Foreign Application Priority Data

Oct. 5, 2015 (JP) .............................. JP2015-197467

(51) Int. Cl.
*G01R 31/36* (2020.01)
*G01R 31/3835* (2019.01)
(Continued)

(52) U.S. Cl.
CPC ........ *G01R 31/3835* (2019.01); *B64C 39/024* (2013.01); *G01R 15/202* (2013.01);
(Continued)

(58) Field of Classification Search
CPC ............ G01R 31/3828; G01R 31/3832; G01R 31/3833; G01R 31/3835; G01R 31/3842; G01R 31/396
See application file for complete search history.

(56) References Cited

U.S. PATENT DOCUMENTS 3,701,010 A * 10/1972 Lieber ..................... G01G 7/00
324/71.1
5,648,717 A * 7/1997 Uskali ................... H01M 10/42
324/428
(Continued)

FOREIGN PATENT DOCUMENTS

CN 1176465 3/1998
CN 1527868 9/2004
(Continued)

OTHER PUBLICATIONS

International Search Report issued in connection with International Patent Application No. PCT/JP2016/003861, dated Nov. 15, 2016. (2 pages).
(Continued)

*Primary Examiner* — Walter L Lindsay, Jr.
*Assistant Examiner* — Milton Gonzalez
(74) *Attorney, Agent, or Firm* — K&L Gates LLP

(57) ABSTRACT

A residual quantity measuring device is provided. The residual quantity measuring device includes a Hall element that is inserted into a path of a current flowing in a battery unit and outputs an output voltage associated with the current; and a Coulomb counter configured to be supplied with the output voltage of the Hall element via a voltage conversion circuit and to detect a total quantity of a current flowing into the battery unit and a current flowing out of the battery unit.

12 Claims, 10 Drawing Sheets

(51) Int. Cl.
*G01R 31/396* (2019.01)
*G01R 31/3828* (2019.01)
*B64C 39/02* (2006.01)
*G01R 15/20* (2006.01)
*G01R 31/00* (2006.01)

(52) U.S. Cl.
CPC ....... *G01R 31/008* (2013.01); *G01R 31/3828* (2019.01); *G01R 31/396* (2019.01); *B64C 2201/027* (2013.01); *B64C 2201/042* (2013.01); *B64C 2201/108* (2013.01)

(56) References Cited

U.S. PATENT DOCUMENTS

| | | | | |
|---|---|---|---|---|
| 6,573,688 | B2* | 6/2003 | Nakanishi | B60L 50/16 320/135 |
| 7,049,813 | B2* | 5/2006 | Morita, Jr. | H02P 6/16 324/207.25 |
| 7,952,327 | B2* | 5/2011 | Kudo | G01R 31/50 320/116 |
| 8,154,312 | B2* | 4/2012 | Borst | G01D 3/08 324/713 |
| 9,205,922 | B1 | 12/2015 | Bouwer | |
| 2005/0077878 | A1 | 4/2005 | Carrier et al. | |
| 2008/0304199 | A1* | 12/2008 | Cruise | H01M 10/4207 361/101 |
| 2013/0045404 | A1 | 2/2013 | Shi | |
| 2014/0061376 | A1* | 3/2014 | Fisher | B64D 27/24 244/62 |
| 2014/0115858 | A1 | 5/2014 | Pisu et al. | |
| 2014/0266127 | A1 | 9/2014 | Sun | |
| 2014/0354213 | A1 | 12/2014 | Rivera-Poventud et al. | |
| 2015/0066262 | A1 | 3/2015 | Chang et al. | |

FOREIGN PATENT DOCUMENTS

| | | |
|---|---|---|
| CN | 104422917 A | 3/2015 |
| CN | 104901747 A | 9/2015 |
| EP | 2 056 115 | 6/2009 |
| JP | 4-38573 | 3/1992 |
| JP | 2007-520180 | 7/2007 |
| JP | 2007-520180 A | 7/2007 |
| JP | 2007-327823 | 12/2007 |
| JP | 2007-327823 A | 12/2007 |
| JP | 2010-223781 A | 10/2010 |

OTHER PUBLICATIONS

"Matrice 100", DJI, [online], Aug. 28, 2015, http://web.archive.org/web/20150828201431/http://developer.dji.com/matrice-100/features/, retrieved on Nov. 7, 2016. (7 pages).

Japanese Office Action dated Feb. 26, 2019 in corresponding Japanese Application No. 2017-544170.

"Matrice 100", [online], Aug. 28, 2015, DJI.com/product/matrice-100.

Chinese Office Action dated Sep. 11, 2019 in corresponding Chinese Application No. 201680057457.3.

Japanese Office Action dated Sep. 10, 2019 in corresponding Japanese Application No. 2017-544170.

Chinese Office Action dated Apr. 29, 2020 in corresponding Chinese Application No. 201680057457.3.

Japanese Office Action dated Sep. 29, 2020 in corresponding Japanese Application No. 2019-16669.

Chinese Office Action dated Aug. 31, 2020 in corresponding Chinese Application No. 201680057457.3.

* cited by examiner

RESIDUAL QUANTITY MEASURING DEVICE, BATTERY PACK, ELECTRIC POWER TOOL, ELECTRIC AIRCRAFT, ELECTRIC VEHICLE, AND POWER SUPPLY DEVICE

CROSS REFERENCE TO RELATED APPLICATIONS

The present application is a continuation of PCT patent application No. PCT/JP2016/003861, filed Aug. 24, 2016, which claims priority to Japanese Priority Patent Application JP2015-197467 filed in the Japan Patent Office on Oct. 5, 2015, the entire contents of which are being incorporated herein by reference.

BACKGROUND

The present technology generally relates to, for example, a residual quantity measuring device which can be applied to measurement of the residual quantity of a lithium ion secondary battery, a battery pack, an electric power tool, an electric aircraft, an electric vehicle and a power supply device.

In recent years, many portable devices such as mobile phones, tablet computers, and small electric power tools have appeared, and the size, weight and the charging time of the portable devices have been desired to be reduced. This is leading to a rapid increase in demand for a battery used as a power source for portable equipment. As a battery that satisfies such a demand, a lithium ion secondary battery using a laminate film is suitable, and a battery pack using the lithium ion secondary battery is known. When the battery pack is used as the power source of the portable device, a battery residual quantity is notified to a user by a battery residual quantity meter.

In the conventional calculation of the battery residual quantity, the following methods are used, for example.

A first method is inputting a potential difference generated across a current measuring resistor into a Coulomb counter to calculate the residual quantity.

A second method is using a Hall element and inputting an output voltage of the Hall element into a successive conversion type A/D converter for use in calculating the residual quantity.

In the first method, the use of a current measuring resistor causes a loss in the current measuring resistor. When the current is large, the loss is problematic. In the second method, due to conversion of the detected current to a discrete value by using the A/D converter, when a large current change in pulse form occurs between sampling periods of the A/D conversion, this current change is difficult to reflect, which might cause the accuracy in calculation of the residual quantity to deteriorate. Further, the accuracy deteriorates due to a quantization error of the A/D converter. In particular, the accuracy deteriorates when the dynamic range of the current change is large.

SUMMARY

The present technology generally relates to a residual quantity measuring device, a battery pack, an electric power tool, an electric aircraft, an electric vehicle and a power supply device that enable highly accurate residual quantity measurement.

According to an embodiment, a residual quantity measuring device is provided. The residual quantity measuring device includes a Hall element that is inserted into a path of a current flowing in a battery unit and outputs an output voltage associated with the current, and a Coulomb counter configured to be supplied with an output voltage via a voltage conversion circuit and to detect a total quantity of a current flowing into the battery unit and a current flowing out of the battery unit.

According to an embodiment of the present disclosure, a battery pack is provided. The battery pack includes a battery unit that includes a secondary battery; a Hall element that is inserted into a path of a current flowing in a battery unit and outputs an output voltage associated with the current; and a Coulomb counter configured to be supplied with an output voltage via a voltage conversion circuit and to detect a total quantity of a current flowing into the battery unit and a current flowing out of the battery unit.

According to another embodiment of the present disclosure, an electric power tool is provided using the battery pack described above as a power source.

In another embodiment, an electric aircraft is provided. The electric aircraft includes the battery pack described above; a plurality of rotary blades; motors that respectively rotate the rotary blades; a support shaft that supports one or more of the rotary blades and the motors; a motor control unit that controls rotation of one or more of the motors; and a plurality of power supply lines that supply electric power for each pair of the motors, in which a plurality of the battery packs are connected to the respective power supply lines.

In a further embodiment, an electric vehicle is provided. The electric vehicle includes the battery pack as described herein according to an embodiment; a conversion device that receives supply of electric power from the secondary battery device and converts the supplied electric power to driving force of a vehicle; and a control device that performs information processing concerning vehicle control based on information concerning the secondary battery device.

According to another embodiment, a power supply device is provided and including the battery pack described herein and supplying electric power to an electronic device connected to the battery pack.

According to another embodiment, an uninterruptible power supply device is provided and including the battery pack described herein and supplying electric power to an electronic device connected to the battery pack.

According to the present technology in an embodiment, the voltage induced by the Hall element, corresponding to the current that flows in the battery unit, is supplied to the Coulomb counter to obtain a residual quantity, thus providing an advantage that no loss occurs even when a large current flows. In addition, the voltage is not A/D converted, thereby enabling prevention of deterioration in accuracy. It should be understood that the present technology is not limited to the current loss and battery deterioration and that other suitable effects relating to the present technology may be realized and as further described herein.

DETAILED DESCRIPTION

The present technology generally relates to a residual quantity measuring device, a battery pack, an electric power tool, an electric aircraft, an electric vehicle and a power supply device that enable highly accurate residual quantity measurement. As described herein, embodiments of the present technology will be described with reference to the drawings.

Figure 1:
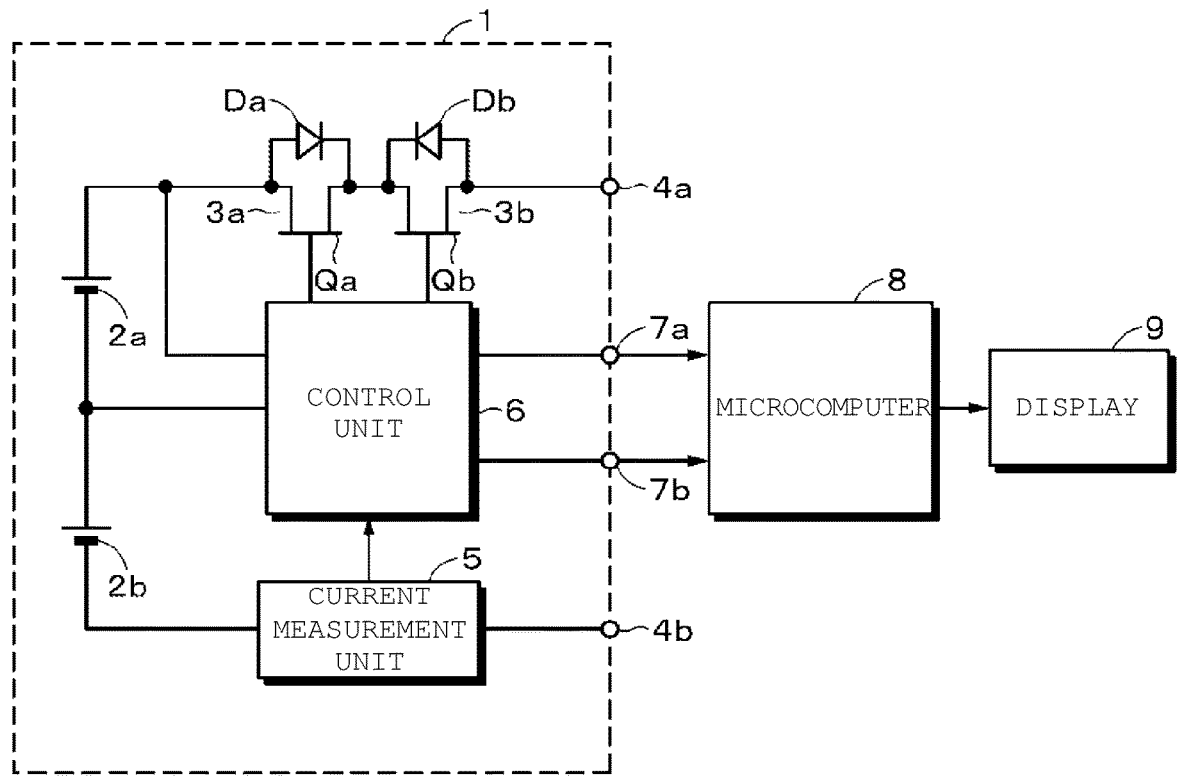
FIG. 1 is a connection diagram of an embodiment in which the present technology is applied to a battery pack.

An embodiment according to the present technology is a battery pack using a laminate film type lithium ion secondary battery. As shown in FIG. 1, a battery pack 1 surrounded by a broken line includes battery cells 2*a* and 2*b* connected in series. The series connection of battery cells 2*a* and 2*b* is an example of a battery unit, and the battery unit can be formed in various configurations, such as one battery cell, a configuration in which three or more battery cells are connected in series, and a configuration in which a battery cell is connected in parallel to each battery cell.

The + side of the battery cell 2*a* is led out as a + side output terminal 4*a* via a charge control switch 3*a* and a discharge control switch 3*b*. The – side of the battery cell 2*b* is led out as a – side output terminal 4*a* via a current measurement unit 5. The charge control switch 3*a* is made up of an FET (Field Effect Transistor) Qa and a diode Da, and the discharge control switch 3*b* is made up of an FET Qb and a diode Db. The FET is not restrictive, and a switching element such as an IGBT (Insulated Gate Bipolar Transistor) may be used. As described later, the current measurement unit 5 is a current sensor using a Hall element and detects a current flowing through the + side output terminal 4*a* and the – side output terminal 4*b*.

The charge control switch 3*a* and the discharge control switch 3*b* are controlled by a control unit 6. The control unit 6 is made up of an MPU (Micro Processing Unit), for example. That is, in normal charging and discharging operation, the FET Qa and the FET Qb are turned on. When the FET Qa of the charge control switch 3*a* is turned on and the FET Qb of the discharge control switch 3*b* is turned off, no discharge current flows and a charge current flows through the diode Db and the FET Qa to the battery cells 2*a* and 2*b*. When the FET Qa of the charge control switch 3*a* is turned off and the FET Qb of the discharge control switch 3*b* is turned on, no charge current flows and a discharge current flows through the diode Da and the FET Qb to the load. When a P-channel type FET is used as the FET Qa and the FET Qb, the FET is turned on by a gate potential lower than a source potential by not smaller than a predetermined value.

The measurement result of the current measurement unit 5 is supplied to the control unit 6. The current measurement unit 5 supplies the value of the charge current or the discharge current to the control unit 6 and outputs to the control unit 6 an integrated value of the current, for example, an integrated value at every predetermined time (e.g., 250 μsec). The charge current and the discharge current are integrated with the signs thereof set opposite to each other. For example, the charge current is set to + and the discharge current is set to –.

A voltage of each of the battery cells 2*a* and 2*b* is supplied to the control unit 6. The control unit 6 receives information of the voltage and the current, and outputs control signals to the charge control switch 3*a* and the discharge control switch 3*b* so as to prevent overcharge, overdischarge, and overcurrent. A temperature sensor for detecting the temperatures of the battery cells 2*a* and 2*b* may be provided inside the battery pack 1, and the output of the temperature sensor may be supplied to the control unit 6, so as to protect against overheating or to correct the current measurement.

Furthermore, the control unit 6 converts the integrated value of the current into digital data and supplies it to the microcomputer 8 outside the battery pack 1 by digital communication. A terminal 7*a* is an output terminal for clock transmission and a terminal 7*b* is an output terminal for data transmission.

The microcomputer 8 is provided, for example, inside an electronic device using the battery pack 1, and displays the residual quantity on a display 9 by using the integrated value of the current received from the control unit 6. The display 9 is formed using an LED (Light Emitting Diode), an LCD (Liquid Crystal Display), and the like. As an example, the residual quantity of the battery unit including the battery cells 2*a* and 2*b* is displayed in units of (Ah (ampere hour)) or (mAh (milliampere hour)). In an embodiment, the control unit 6 inside the battery pack 1 itself may form data for displaying the residual quantity by using the integrated value of the current.

Figure 2:
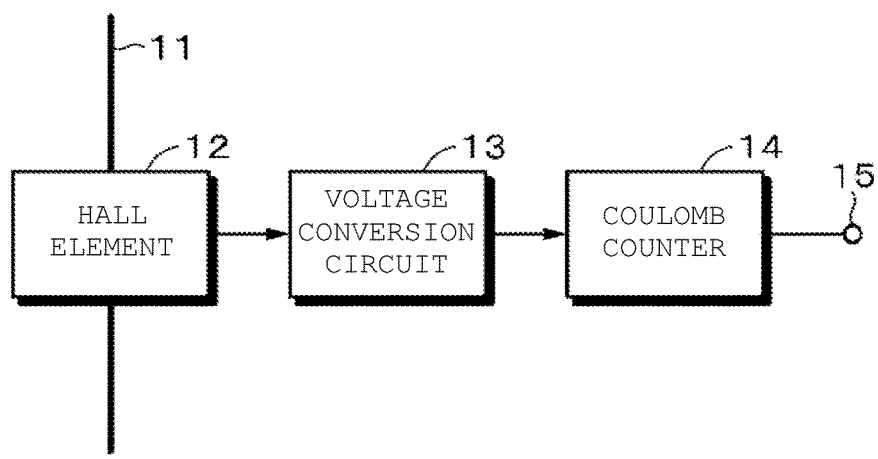
FIG. 2 is a connection diagram of an example of a current measurement unit according to an embodiment.

An example of the current measurement unit 5 according to an embodiment will be described with reference to FIG. 2. A Hall element 12 is provided on a current line 11 for the battery cells 2*a* and 2*b*. Specifically, the current line 11 passes through a ring-shaped core, and the Hall element 12 is disposed in the gap of the core. A voltage is induced in the Hall element 12 in accordance with a magnetic field generated in the core by the current flowing through the current line 11. This voltage is taken out as the output voltage of the Hall element.

The output voltage of the Hall element 12 is supplied to a voltage conversion circuit 13. The voltage conversion circuit 13 converts the output voltage of the Hall element 12 to an appropriate voltage. The output voltage of the Hall element 12 is a relatively large value, and the voltage conversion circuit 13 is thus caused to further decrease the voltage value.

The output voltage of the voltage conversion circuit 13 is supplied to a Coulomb counter 14. The Coulomb counter 14 forms an integrated value 15 obtained by integrating current values at predetermined periods. In principle, the integrated value 15 of the current can be formed by a configuration where a capacitor charged with a + voltage and discharged with a – voltage is used to take out the output voltage of the capacitor in each predetermined period and reset the charge of the capacitor. The integrated value 15 outputted from the current measurement unit 5 is supplied to the control unit 6 and is converted into a digital signal by an A/D converter in the control unit 6. The voltage conversion circuit 13 and the Coulomb counter 14 may be provided in the control unit 6.

Figure 3:
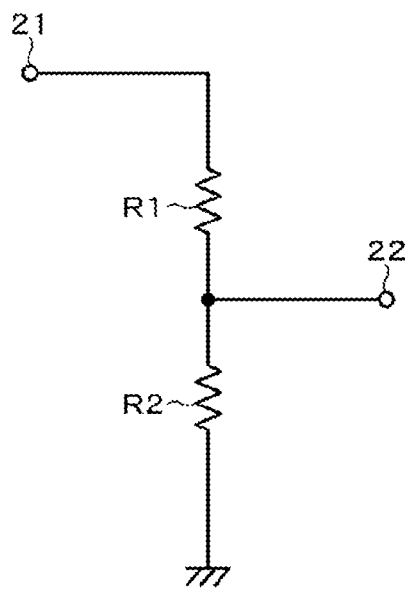
FIG. 3 is a connection diagram of an example of a voltage conversion circuit according to an embodiment.

An example of the voltage conversion circuit 13 according to an embodiment is shown in FIG. 3. A voltage output from the Hall element 12 is supplied to an input terminal 21. A series connection of resistors R1 and R2 is provided between an input terminal 21 and the ground, and an output terminal 22 is led out from a connection midpoint of the resistors R1 and R2. A voltage Vo taken out to the output terminal 22 is a voltage obtained by dividing an input voltage (the output voltage of the Hall element 12) Vi with the resistors R1 and R2. When a voltage division ratio (R2/(R1+R2)) is expressed as a proportional coefficient K (<1), Vo=K×Vi.

Figure 4:
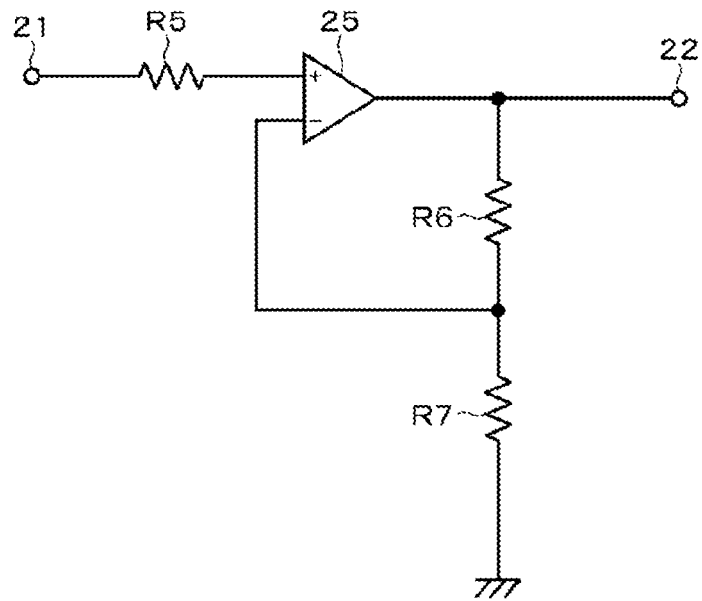
FIG. 4 is a connection diagram of an example of the voltage conversion circuit according to an embodiment.

FIG. 4 shows an example (voltage conversion circuit 13a) of the voltage conversion circuit according to an embodiment. The input terminal 21 is supplied to a non-inverting input terminal of an operational amplifier 25 via a resistor R5, and the output terminal of the operational amplifier 25 is led out as the output terminal 22 and grounded via resistors R6 and R7. A connection midpoint of the resistors R6 and R7 is connected to an inverting input terminal of the operational amplifier 25.

In the configuration of FIG. 4, the output voltage can be changed by changing the ratio of the resistors R6 and R7. For example, when (R6=R7) and the input voltage is 1 V, an output voltage of 2 V is obtained.

Figure 5:
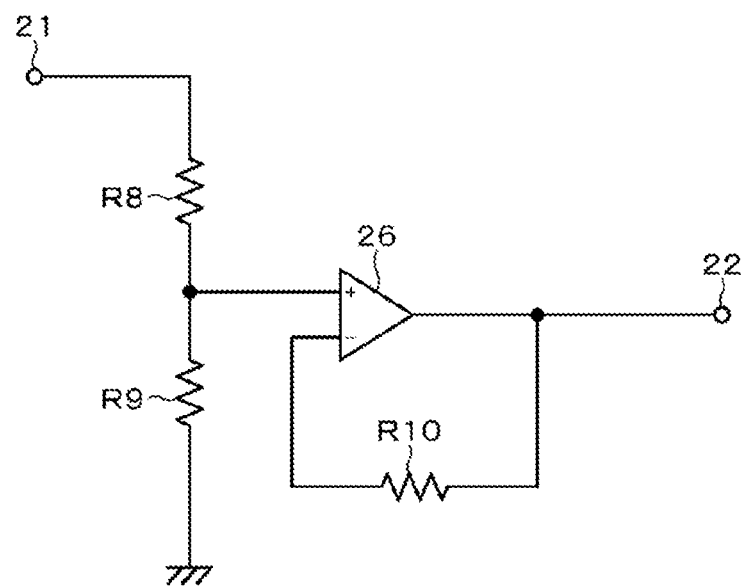
FIG. 5 is a connection diagram of an example of the voltage conversion circuit according to an embodiment.

FIG. 5 shows an example (voltage conversion circuit 13b) of the voltage conversion circuit according to an embodiment. The input terminal 21 is grounded via resistors R8 and R9. A connection midpoint of the resistors R8 and R9 is connected to a non-inverting input terminal of an operational amplifier 26. The output terminal of the operational amplifier 26 is led out as the output terminal 22 of the operational amplifier 26 and also connected to an inverting input terminal of the operational amplifier 26 via a resistor R10.

In the configuration of FIG. 5, the output voltage can be changed by changing the ratio of the resistors R8 and R9. For example, when (R8=R9) and the input voltage is 2 V, an output voltage of 1 V is obtained.

Figure 6:
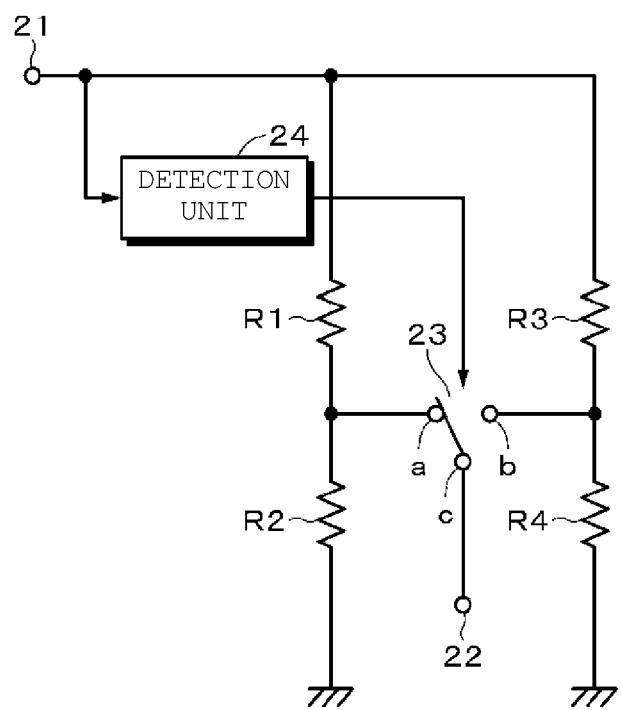
FIG. 6 is a connection diagram of an example of the voltage conversion circuit according to an embodiment.

FIG. 6 shows an example (voltage conversion circuit 13c) of the voltage conversion circuit according to an embodiment. A series connection of the resistors R1 and R2 and a series connection of the resistors R3 and R4 are provided between the input terminal 21 and the ground. A connection midpoint of the resistors R1 and R2 is connected to one input terminal a of a switch circuit 23, and a connection midpoint of the resistors R3 and R4 is connected to the other input terminal b of the switch circuit 23. An output terminal c of the switch circuit 23 is led out as the output terminal 22. Assuming that a proportional coefficient corresponding to a voltage division ratio of the resistors R1 and R2 is K1, and a proportional coefficient corresponding to a voltage division ratio of the resistors R3 and R4 is K2, then (K1>K2).

A control signal for controlling the switch circuit 23 is formed by a detection unit 24. The detection unit 24 detects the level of the input voltage (the output voltage of the Hall element 12). That is, the input voltage is compared with a threshold, and a control signal corresponding to the comparison result of the input voltage and the threshold is formed. When the input voltage is lower than the threshold, there is formed a control signal for performing control so as to connect between the input terminal a and the output terminal c of the switch circuit 23. In this case, an output voltage of (Vo=K1 Vi) is generated at the output terminal 22. On the other hand, when the input voltage is not lower than the threshold, there is formed a control signal for performing control so as to connect between the input terminal b and the output terminal c of the switch circuit 23. In this case, an output voltage of (Vo=K2 Vi) is generated at the output terminal 22. Note that hysteresis may be given by using two thresholds.

In this manner, a larger proportionality factor K1 is selected when the input voltage level is lower, and a smaller proportionality factor K2 is selected when the input voltage level is higher, whereby it is possible to accurately measure a current from a small current to a large current. Further, as for the large current, it is possible to measure a larger current value due to expansion of a dynamic range. Moreover, there are cases where a loss is acceptable in a range for measuring the small current, and hence a voltage generated across the conventional current measuring resistor may be measured.

Figure 7:
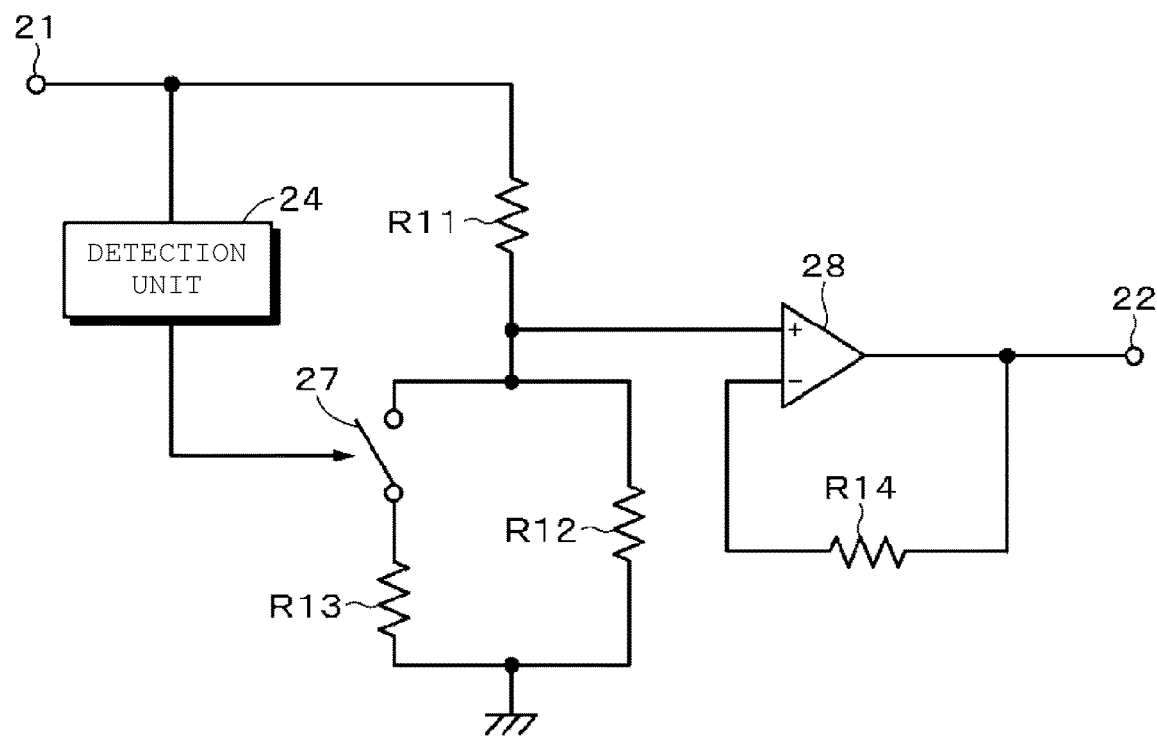
FIG. 7 is a connection diagram of an example of the voltage conversion circuit according to an embodiment.

FIG. 7 shows an example (voltage conversion circuit 13d) of the voltage conversion circuit according to an embodiment. Similarly to another example described herein, the detection unit 24 for detecting the level of the input voltage (the output voltage of the Hall element 12) is provided, and a switch circuit 27 is controlled by a control signal formed by the detection unit 24. The input terminal 21 is grounded via resistors R11 and R12 and is also connected to a non-inverting input terminal of an operational amplifier 28. The switch circuit 27 and the resistor R13 are connected in parallel with the resistor R12. The output terminal of the operational amplifier 28 is led out as the output terminal 22 and also connected to the non-inverting input terminal of the operational amplifier 28 via the resistor R14.

In the configuration of FIG. 7, the switch circuit 27 can be turned on when the input voltage is larger than a threshold, and the output voltage can be changed to a smaller output voltage. Therefore, similarly to the configuration of FIG. 6, it is possible to accurately measure a current from a small current to a large current, and as for the large current, it is possible to measure a larger current value due to expansion of the dynamic range.

As described herein, in the conventional configuration in which the detection resistor is inserted in the current path, the current can be measured by using the Hall element even with a large current that causes a large loss. In addition, it is possible to measure the current in the small current region, which is difficult to measure with the Hall element, by switching the proportional coefficient of the voltage conversion circuit.

The battery according to an embodiment of the present technology described herein can provided in, or supply electric power to devices such as electronic devices, electric vehicles, and power storage devices. Examples of the electronic device include a laptop computer, a smartphone, a tablet terminal, a PDA (Personal Digital Assistant), a mobile phone, a wearable terminal, a cordless phone slave, a video movie, a digital still camera, an electronic book, an electronic dictionary, a music player, a radio, a headphone, game machine, a navigation system, a memory card, a pacemaker, a hearing aid, an electric power tool, an electric shaver, a refrigerator, an air conditioner, a television, a stereo, a water heater, a microwave oven, a dishwasher, a washing machine, a drier, lighting equipment, a toy, medical equipment, a robot, a road conditioner, and a traffic light. It should be appreciated and understood that any suitable type of electric device can be utilized according to an embodiment.

Examples of the electric vehicle include a railway vehicle, a golf cart, an electric cart, and an electric vehicle (including a hybrid vehicle), in which the battery is used as driving power sources or auxiliary power sources. Examples of the power storage device include power storage power sources for buildings including houses or power generation facilities. It should be appreciated and understood that any suitable type of electric vehicle can be utilized according to an embodiment.

Figure 8:
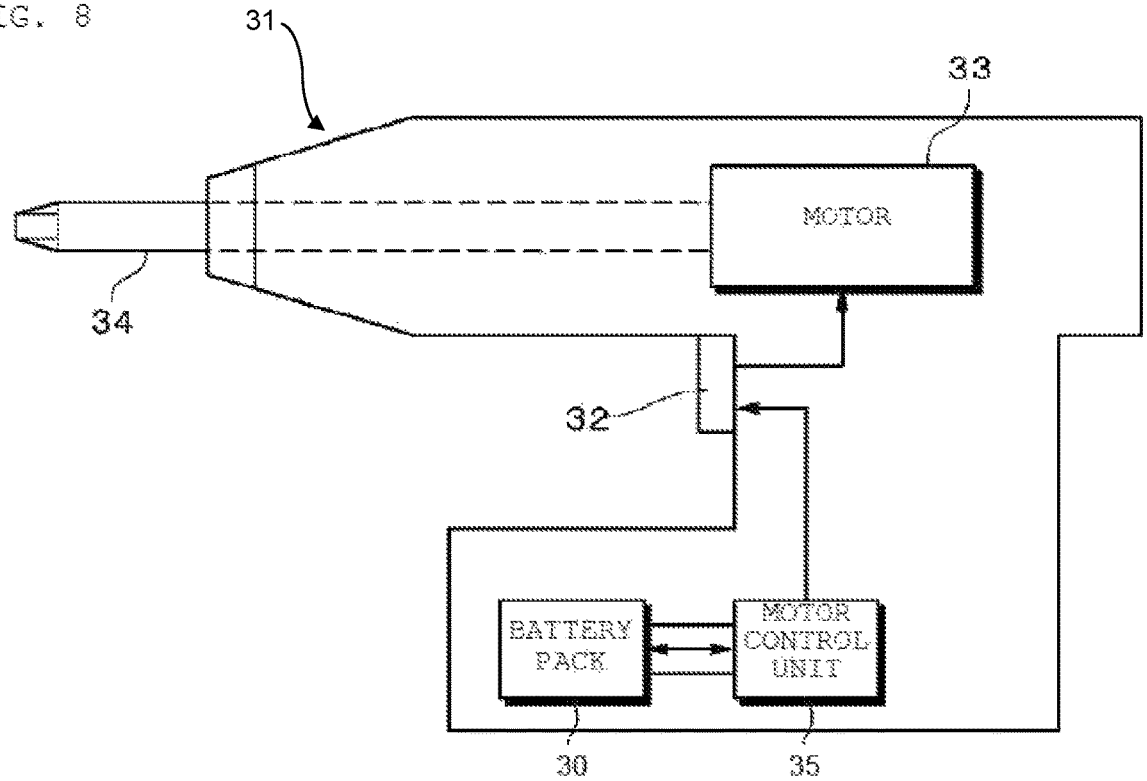
FIG. 8 is a connection diagram illustrating an electric power tool as an example of the present technology according to an embodiment.

With reference to FIG. 8, a schematic description will be given of an example of an electric power tool, for example, an electric driver, to which the present technology can be applied according to an embodiment. A motor 33 such as a DC motor is housed in a main body of an electric driver 31. The rotation of the motor 33 is transmitted to a shaft 34, and a screw is driven into an object by the shaft 34. A trigger switch 32 operated by the user is provided in the electric driver 31.

A battery pack 30 and a motor control unit 35 are housed in a lower housing of a handle of the electric driver 31. The battery pack 1 according to the present technology can be used as the battery pack 30 according to an embodiment. The motor control unit 35 controls the motor 33. Each unit of the electric driver 31 other than the motor 33 may be controlled by the motor control unit 35. Although not shown, the battery pack 30 and the electric driver 31 are engaged with each other by engaging members provided respectively. A microcomputer is provided in each of the battery pack 30 and the motor control unit 35 as described herein according to an embodiment. A battery power is supplied from the battery pack 30 to the motor control unit 35, and information of the battery pack 30 is communicated between the microcomputers.

The battery pack 30 is, for example, removable from the electric driver 31. The battery pack 30 may be incorporated in the electric driver 31. The battery pack 30 is attached to a charging device at the time of charging. When the battery pack 30 is attached to the electric driver 31, a part of the battery pack 30 may be exposed to the outside of the electric driver 31 so that the user can visually recognize the exposed portion. For example, an LED may be provided on the exposed portion of the battery pack 30 so that the user can confirm the light emission and extinction of the LED.

The motor control unit 35 controls, for example, the rotation/stop and the rotation direction of the motor 33. Further, at the time of over discharge, the power supply to the load is cut off. For example, the trigger switch 32 is inserted between the motor 33 and the motor control unit 35, and when a user pushes the trigger switch 32, power is supplied to the motor 33 to rotate the motor 33. When the user returns the trigger switch 32, the rotation of the motor 33 stops.

Figure 9:
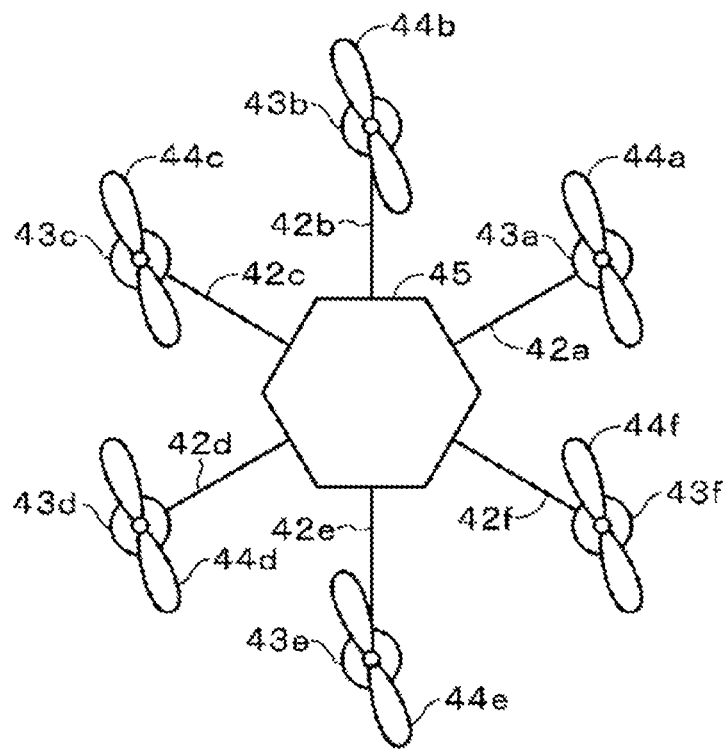
FIG. 9 is a connection diagram illustrating an unmanned aerial vehicle as an example of the present technology according to an embodiment.
Figure 10:
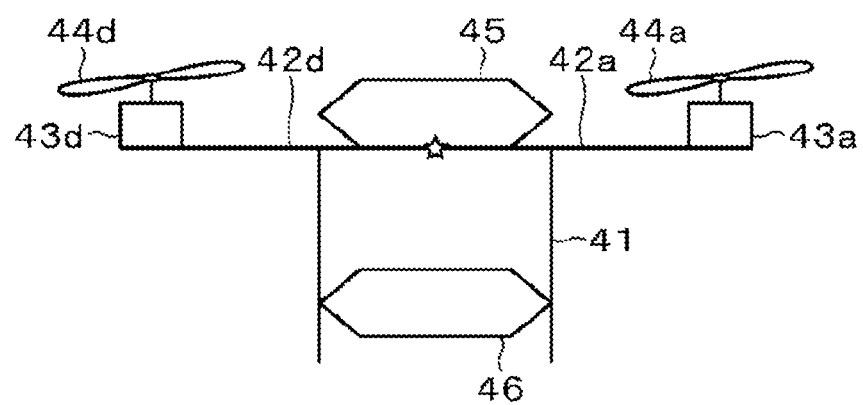
FIG. 10 is a front view illustrating a configuration of the unmanned aerial vehicle according to an embodiment.

This technology can be applied to a power source of an unmanned aerial vehicle (so-called drone) in an embodiment. FIG. 9 is a plan view of the unmanned aerial vehicle, and FIG. 10 is a front view of the unmanned aerial vehicle. A body includes a cylindrical or square tubular body portion 41 as a center portion and support shafts 42a to 42f fixed to the upper portion of the body portion 41. As an example, the body portion 41 has a hexagonal cylindrical shape, and the six support shafts 42a to 42f extend radially from the center of the body portion 41 at regular angular intervals. The body portion 41 and the support shafts 42a to 42f include a lightweight and high strength material.

Further, the shape, placement and the like of each component are designed such that the center of gravity of the body including the body portion 41 and the support shafts 42a to 42f is on a vertical line passing through the centers of the support shafts 42a to 42f. Moreover, the circuit unit 45 and the battery unit 46 are attached such that the center of gravity is located on the vertical line.

Motors 43a to 43f as drive sources of rotary blades are attached to the tips of the support shafts 42a to 42f, respectively. Rotary blades 44a to 44f are attached to rotating shafts of the motors 43a to 43f. A circuit unit 45 including a motor control circuit for controlling each motor is attached to the central portion where the support shafts 42a to 42f intersect.

Further, a battery unit 46 as a power source is disposed at a position below the body portion 41. The battery unit 46 includes three battery packs so as to supply electric power to a pair of motors and rotary blades having opposing intervals of 180 degrees. Each battery pack includes, for example, a lithium ion secondary battery and a battery control circuit for controlling charge and discharge. The battery pack 1 according to the present technology can be used as a battery pack according to an embodiment as described herein. The motor 43a and the rotary blade 44a form a pair with the motor 43d and the rotary blade 44d. Similarly, (motor 43b, rotary blade 44b) and (motor 43e, rotary blade 44e) form a pair, and (motor 43c, rotary blade 44c) and (motor 43f, rotary blade 44f) form a pair. These pairs are equal to the number of battery packs according to an embodiment.

Figure 11A:
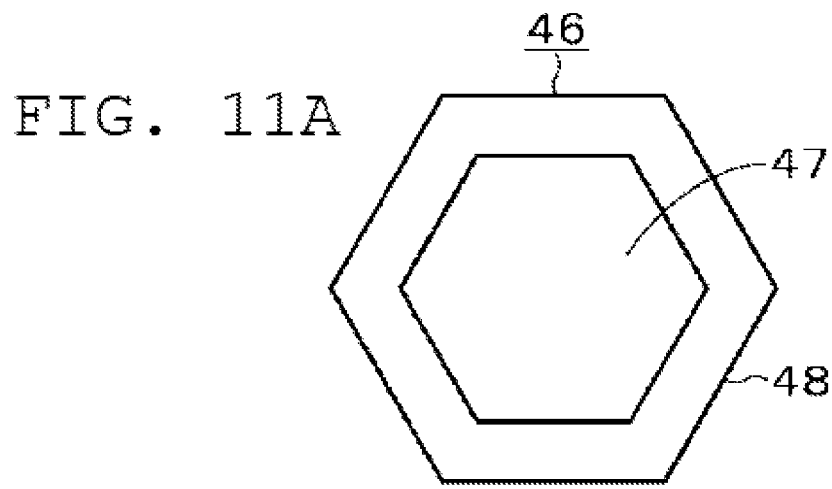
FIGS. 11A and 11B are schematic diagrams illustrating a configuration of a battery unit according to an embodiment.
Figure 11B:
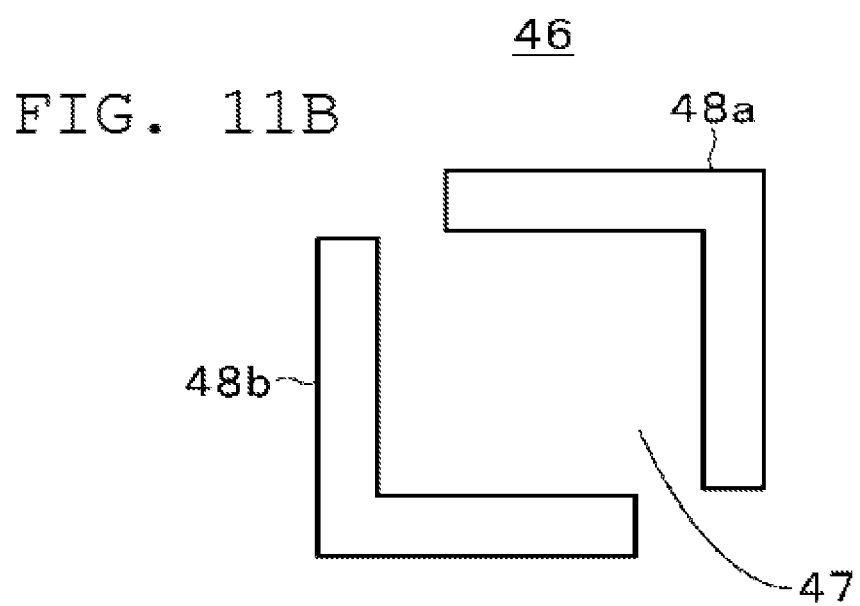

The battery unit 46 is removably attached to, for example, the inside of the body portion 41. As shown in FIGS. 11A and 11B, the battery unit 46 has displacement and an outer shape such that the battery unit 46 has a symmetrical shape with respect to the center which is the position of the center of gravity of the airframe and has the center opening 47. FIG. 11A is an example in which a hollow case 48 having a planar shape of a regular hexagon around the center opening 47 is provided and the battery pack is stored in the case 48. As shown in FIG. 11B, the battery pack may be housed in separated cases 48a and 48b.

Making the center of gravity of the battery unit 46 coincide with the center of gravity of the airframe increases the stability of the center of gravity. Furthermore, with a center opening 47 provided, the wind passes through the central opening 47 during flight, enabling reduction in influence of the wind and the like. This, as a result, facilitates the attitude control, to enable extension of the flight time and prevention of a temperature rise of the battery.

Figure 12:
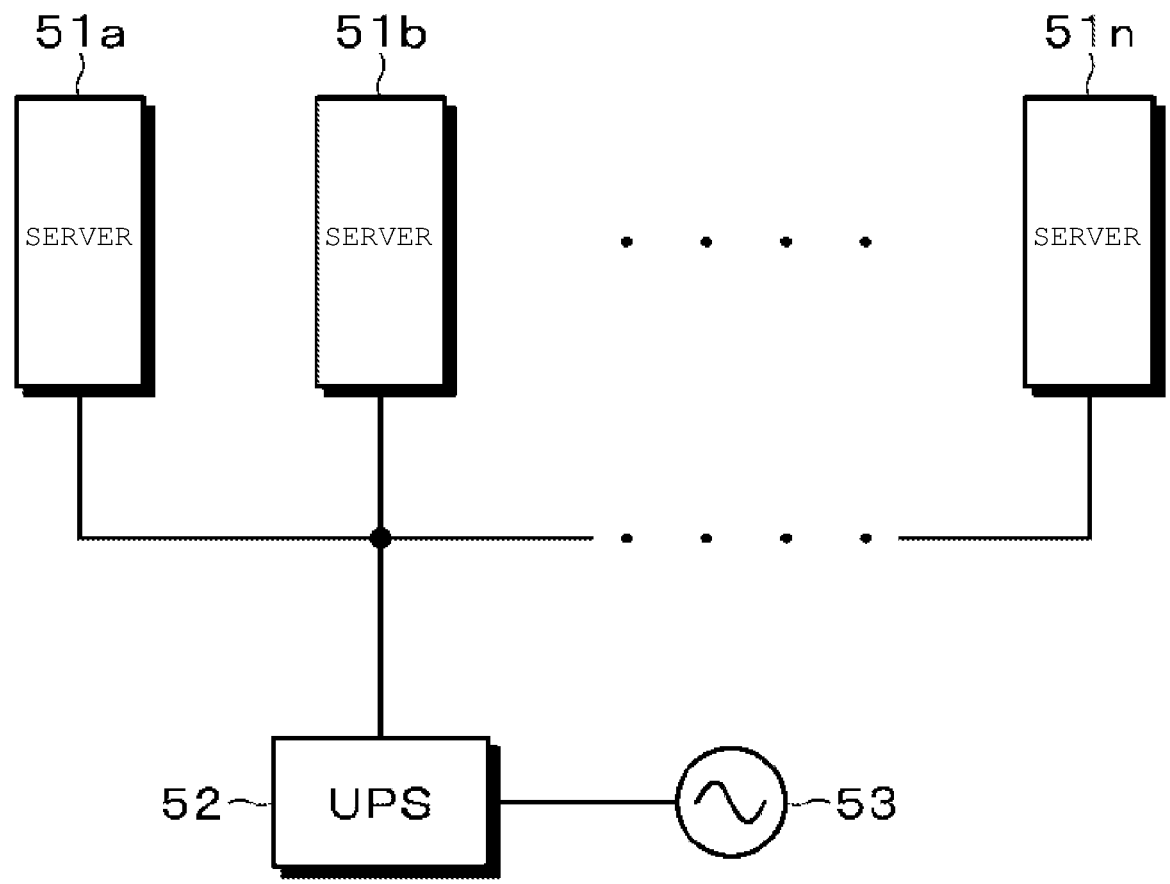
FIG. 12 is a block diagram illustrating an uninterruptible power supply device as an example of the present technology according to an embodiment.

In an embodiment, as shown in FIG. 12, an uninterruptible power supply device 52 is provided for n servers 51a to 51n. The uninterruptible power supply device 52 is disposed between the servers 51a to 51n and a system power source 53. When the power supply from the system power source 53 to the servers 51a to 51n is interrupted, the uninterruptible power supply device 53 supplies power to the servers 51a to 51n. The battery pack according to the present technology can be used as the battery pack provided in the uninterruptible power supply device 53 according to an embodiment as described herein.

Figure 13:
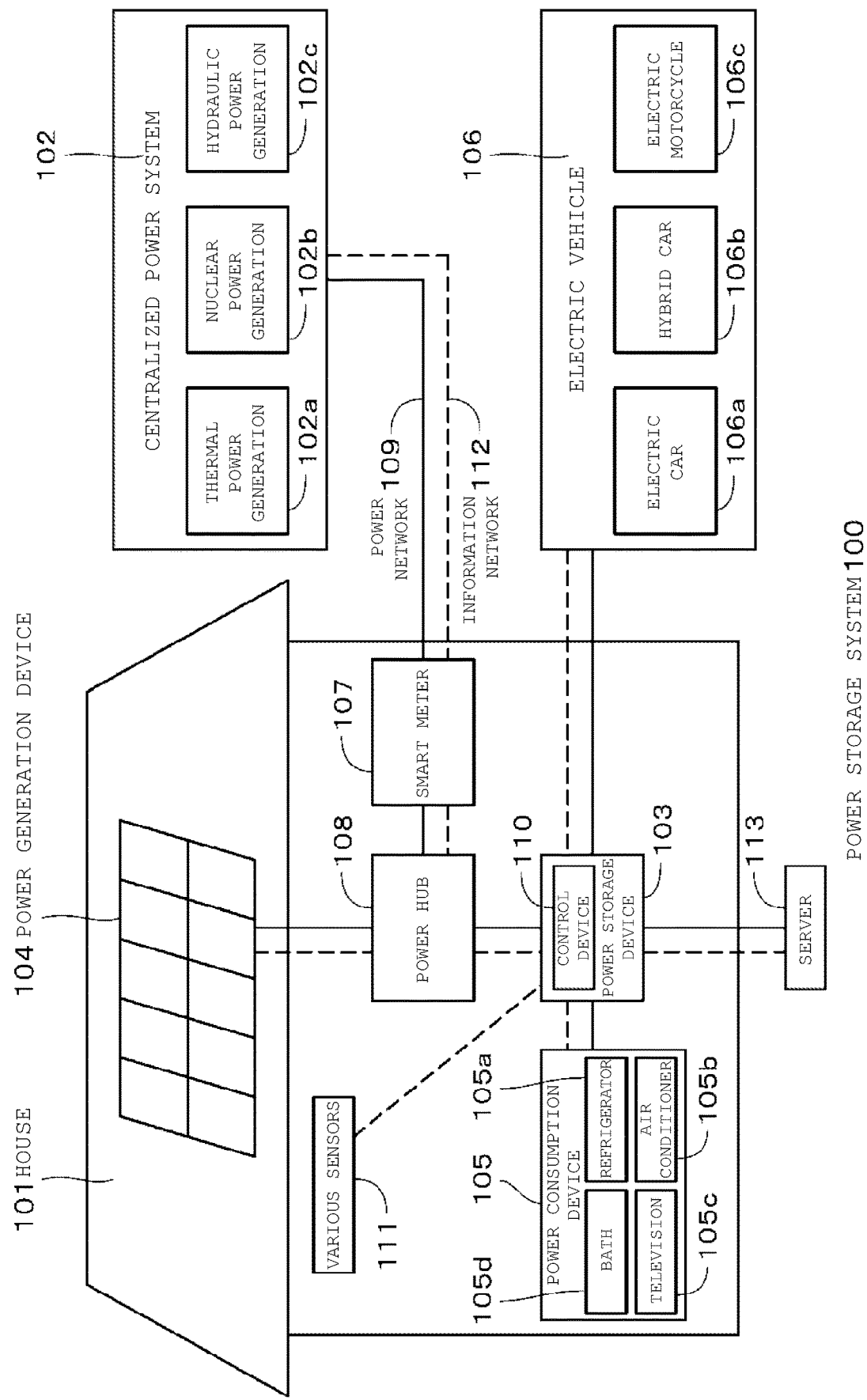
FIG. 13 is a schematic diagram illustrating an example of the present technology according to an embodiment.

In an embodiment with reference to FIG. 13, the power storage device using the battery of the present technology is applied to a power storage system for a house. For example, in a power storage system 100 for a house 101, electric power is supplied from a centralized power system 102, such as a thermal power generation 102a, a nuclear power generation 102b, and a hydraulic power generation 102c, via a power network 109, an information network 112, a smart meter 107, a power hub 108, and the like, to a power storage device 103. Along with this, electric power is supplied from an independent power source such as a power generation device 104 in the home to the power storage device 103. The electric power supplied to the power storage device 103 is stored. Electric power to be used in the house 101 is supplied using the power storage device 103. A similar power storage system can be used not only for the house 101 but also for a building according to an embodiment.

The house 101 is provided with the power generation device 104, a power consumption device 105, the power storage device 103, a control device 110 for controlling each device, the smart meter 107, and a sensor 111 for acquiring various kinds of information. Each device is connected by the power network 109 and the information network 112. A solar cell, a fuel cell, or the like is used as the power generation device 104, and the generated electric power is supplied to one or both of the power consumption device 105 and the power storage device 103. The power consumption device 105 includes, for example, a refrigerator 105a, an air conditioner 105b being an air conditioner, a television 105c being a television receiver, a bath 105d, and the like. Further, the electric power consumption device 105 includes an electric vehicle 106. The electric vehicle 106 includes, for example, an electric car 106a, a hybrid car 106b, an electric motorcycle 106c and any other suitable type of electric vehicle.

The battery pack of the present technology in an embodiment is applied to the power storage device 103. The smart meter 107 has the function of measuring a usage quantity of commercial power and sending the measured usage quantity to an electric power company. The power network 109 may be any one or a combination of DC power feed, AC power feed, and non-contact power feed.

The various sensors 111 include, for example, a human sensor, an illumination sensor, an object detection sensor, a power consumption sensor, a vibration sensor, a contact sensor, a temperature sensor, an infrared sensor, and the like. Information acquired by the various sensors 111 is transmitted to the control device 110. Based on the information from the sensor 111, the state of the weather, the state of the person, and the like are grasped and the power consumption device 105 can be automatically controlled to minimize energy consumption. Further, the control device 110 can transmit information on the house 101 to an external electric power company or the like via the Internet.

The power hub 108 performs processes such as branching of power lines and DC/AC conversion. As a communication method of the information network 112 connected to the control device 110, a method of using a communication interface such as UART (Universal Asynchronous Receiver-Transmitter: transmission/reception circuit for asynchronous serial communication), and a method of using a sensor network in accordance with a wireless communication standard, such as Bluetooth (registered trademark), ZigBee, or Wi-Fi, can be utilized, for example, and any suitable other type of method. The Bluetooth (registered trademark) system is applied to multimedia communication and can perform one-to-many connection communication. ZigBee uses the physical layer of IEEE (Institute of Electrical and Electronics Engineers) 802.15.4. IEEE 802.15.4 is a name of a short-range wireless network standard called PAN (Personal Area Network) or W (Wireless) PAN.

The control device 110 is connected to an external server 113. The server 113 may be managed by any of the house 101, the electric power company, or a service provider. The information transmitted and received by the server 113 is, for example, power consumption information, daily life pattern information, a power fee, weather information, natural disaster information, and power trade information and any suitable other type of information. This information may be transmitted and received from a power consuming device (e.g., a television receiver) in the home, but it may be transmitted and received from a device outside the home (e.g., a mobile phone) and in any suitable other manner. This information may be displayed on a device having a display function, such as a television receiver, a mobile phone, or a PDA (Personal Digital Assistants) or displayed on any suitable other type of device.

The control device 110 that controls each unit is made up of a CPU (Central Processing Unit), a RAM (Random Access Memory), a ROM (Read Only Memory), and the like, and is stored in the power storage device 103 in this example. The control device 110 is connected to the power storage device 103, power generation device 104 in the home, the power consumption device 105, the various sensors 111, the server 113, and the information network 112, and has the function of adjusting a usage quantity of commercial electric power and a quantity of electric power generated. The control device 110 may further be equipped with the function of conducting power trading in the power market and configure in any other suitable manner.

As described herein, not only the centralized power system 102 such as the thermal power generation 102a, the nuclear power generation 102b, and the hydraulic power generation 102c, but also electric power generated by the power generation device 104 (solar power generation, wind power generation) in the home can be stored in the power storage device 103. Therefore, even when the generated power of the power generation device 104 in the home fluctuates, it is possible to perform control such that the quantity of electric power sent to the outside is made constant or discharged as necessary. For example, such a method of using the power storage device 103 is possible where electric power obtained by photovoltaic power generation is stored into the power storage device 103, and night-time electric power with a lower charge is stored in the power storage device 103 in the night time, while the electric power stored by the power storage device 103 is discharged in a time zone of the daytime when the electric charge is higher.

An example in which the control device 110 is stored in the power storage device 103 has been described herein, and alternatively, the control device 110 may be stored in the smart meter 107 or may be configured solely. Further, the power storage system 100 may be used for a plurality of homes in a multiple dwelling house, or may be used for a plurality of detached houses.

Figure 14:
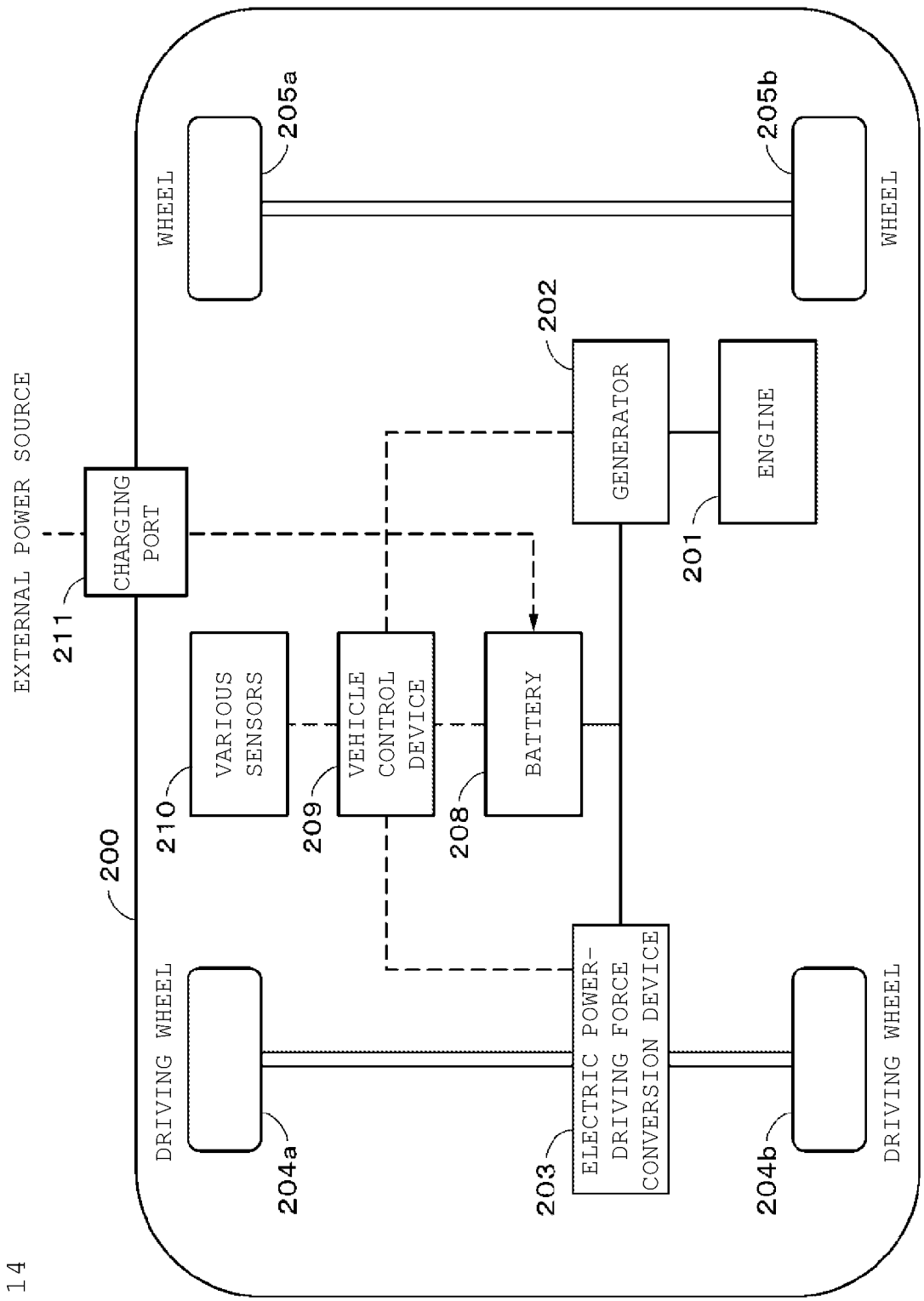
FIG. 14 is a schematic diagram illustrating an example of the present technology according to an embodiment.

In an embodiment with reference to FIG. 14, the present technology is applied to an electric storage system for a vehicle. FIG. 14 schematically shows an example of a configuration of a hybrid vehicle including a series hybrid system. The series hybrid system includes a vehicle that travels with an electric power-driving force conversion device that uses electric power generated by a generator driven by an engine, or electric power temporarily stored in a battery.

In an embodiment, the hybrid vehicle 200 includes, for example, an engine 201, a generator 202, an electric power-driving force conversion device 203, a driving wheel 204a, a driving wheel 204b, a wheel 205a, a wheel 205b, a battery 208, a vehicle control device 209, various sensors 210, and a charging port 211. The battery pack of the present technology described herein is applied to the battery 208. It should be appreciated that the hybrid vehicle can include any suitable other types of components.

The hybrid vehicle 200 operates with the electric power-driving force conversion device 203 as a power source. An example of the electric power-driving force conversion device 203 is any suitable type of motor. The electric power-driving force conversion device 203 is operated by the electric power of the battery 208, and the rotating force of the electric power driving force converting device 203 is transmitted to the driving wheels 204a and 204b. By using DC-AC conversion or inverse conversion (AC-DC conversion) in a required portion, the electric power-driving force conversion device 203 can be applied to both an AC motor and a DC motor. The various sensors 210 control the engine speed via the vehicle control device 209 and control the opening degree (throttle opening degree) of a throttle valve, not shown. The various sensors 210 include a speed sensor, an acceleration sensor, an engine speed sensor, and the like and combinations thereof.

The rotating force of the engine 201 is transmitted to the generator 202, and the electric power generated by the generator 202 can be accumulated in the battery 208 by the rotating force.

When the hybrid vehicle 200 decelerates by a braking mechanism, not shown, the resistance force at the time of deceleration is added to the electric power-driving force conversion device 203 as the rotating force, and regenerative electric power generated by the electric power-driving force conversion device 203 is stored into the battery 208.

When the battery 208 is connected to a power source external to the hybrid vehicle 200, it is also possible to receive power supply from the external power source using the charging port 211 as an input port and store the received electric power.

In an embodiment, an information processing device (not shown) is provided that performs information processing relating to, for example, vehicle control based on information on a secondary battery. For example, the information processing device can include an information processing device for displaying a battery residual quantity based on information on the residual quantity of the battery.

As described herein according to an embodiment, the series hybrid car operates with the motor by using the electric power generated by the generator driven by the engine, or the electric power temporarily stored in the battery. However, the present technology can also be effectively applied to a parallel hybrid vehicle, in which both outputs of the engine and the motor are drive sources, and three systems of traveling only with the engine, traveling only with the motor, and traveling with the engine and the motor, are appropriately switched and used. Further, the present technology can also be effectively applied to a so-called electric vehicle that operates and travels by driving only by a driving motor without using an engine.

Although the embodiments of the present technology have been specifically described herein, the present technology is not limited to the embodiments described herein, where various suitable modifications and applications are possible and should be appreciated and understood. For example, the configurations, methods, processes, shapes, materials, numerical values, and the like mentioned in the above embodiment are mere examples, and different configurations, methods, processes, shapes, materials, numerical values, and the like may be used, as necessary.

The present technology is described below in further detail according to an embodiment.

(1)
A residual quantity measuring device, including:
a Hall element that is inserted into a path of a current flowing in a battery unit and outputs a voltage induced corresponding to the current; and
a Coulomb counter that is supplied with the output voltage of the Hall element via a voltage conversion circuit and detects a total quantity of a current flowing into the battery unit and a current flowing out of the battery unit.

(2)
The residual quantity measuring device described in (1), in which the voltage conversion circuit supplies the Coulomb counter with a voltage obtained by multiplying the output voltage of the Hall element by a coefficient, and the coefficient is controlled in accordance with a magnitude of the output voltage.

(3)
The residual quantity measuring device described in (1) or (2), further including a display unit that displays a residual quantity of the battery unit obtained from an output of the Coulomb counter.

(4)
A battery pack, including:
a battery unit that includes a secondary battery;
a Hall element that is inserted into a path of a current flowing in a battery unit and outputs a voltage induced corresponding to the current; and
a Coulomb counter that is supplied with the output voltage of the Hall element via a voltage conversion circuit and detects a total quantity of a current flowing into the battery unit and a current flowing out of the battery unit.

(5)
An electric power tool, using the battery pack described in (4) as a power source.

(6)
An electric aircraft, including:
the battery pack described in (4);
a plurality of rotary blades;
motors that respectively rotate the rotary blades;
a support shaft that supports the rotary blade and the motor;
a motor control unit that controls rotation of the motor; and
a plurality of power supply lines that supply electric power to each pair of the motors, in which
a plurality of the battery packs are connected to the respective power supply lines.

(7)
The electric aircraft described in (6), in which a plurality of pairs of the rotary blades facing each other are provided, and
the plurality of pairs of the rotary blades and the plurality of the battery packs are the same in number.

(8)
An electric vehicle, including:
the battery pack described in (4);
a conversion device that receives supply of electric power from the secondary battery device and converts the supplied electric power to driving force of a vehicle; and
a control device that performs information processing concerning vehicle control based on information concerning the secondary battery device.

(9)
A power supply device, including the battery pack described in (4) and supplying electric power to an electronic device connected to the battery pack.

(10) An uninterruptible power supply device, including the battery pack described in (4) and supplying electric power to an electronic device connected to the battery pack.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A residual quantity measuring device, comprising:
a Hall element that is inserted into a path of a current flowing in a battery unit and outputs an output voltage associated with the current; and
a Coulomb counter configured to be supplied with the output voltage of the Hall element via a voltage conversion circuit and to detect a total quantity of a current flowing into the battery unit and a current flowing out of the battery unit;
wherein the voltage conversion circuit includes:
an input terminal configured to be supplied with the output voltage of the Hall element,
a first voltage divider that is provided between the input terminal and a ground;
a second voltage divider that is provided in parallel with the first voltage divider and has a ratio of voltage division different from the first voltage divider; and
wherein the Coulomb counter is configured to be supplied with an output voltage from the first divider or the second divider.

2. The residual quantity measuring device according to claim 1, wherein
the voltage conversion circuit is configured to supply the Coulomb counter with a voltage obtained by multiplying the output voltage of the Hall element by a coefficient, and
wherein the coefficient is associated with a magnitude of the output voltage.

3. The residual quantity measuring device according to claim 1, further comprising
a display unit that displays a residual quantity of the battery unit obtained from an output of the Coulomb counter.

4. The residual quantity measuring device according to claim 1, wherein the voltage conversion circuit is configured to selectively supply the output voltage from the first voltage divider or the second voltage divider based on a magnitude of the output voltage of the Hall element.

5. The residual quantity measuring device according to claim 4, wherein the first voltage divider has a ratio of voltage division smaller than the second voltage divider, wherein the voltage conversion circuit supplies the output voltage of the first voltage division to the Coulomb counter when the output voltage of the Hall element is higher than a threshold, and wherein the voltage conversion circuit supplies the output voltage of the second voltage division to the Coulomb counter when the output voltage of the Hall element is lower than the threshold.

6. A battery pack, comprising:
a battery unit that includes a secondary battery;
a Hall element that is inserted into a path of a current flowing in a battery unit and outputs an output voltage associated with the current; and
a Coulomb counter configured to be supplied with the output voltage of the Hall element via a voltage conversion circuit and to detect a total quantity of a current flowing into the battery unit and a current flowing out of the battery unit;
wherein the voltage conversion circuit includes:
an input terminal configured to be supplied with the output voltage of the Hall element,
a first voltage divider that is provided between the input terminal and a ground;
a second voltage divider that is provided in parallel with the first voltage divider and has a ratio of voltage division different from the first voltage divider; and
wherein the Coulomb counter is configured to be supplied with an output voltage from the first divider or the second divider.

7. An electric power tool, using the battery pack according to claim 6 as a power source.

8. An electric aircraft, comprising:
a plurality of the battery packs according to claim 6;
a plurality of rotary blades and motors that respectively rotate the rotary blades;
a support shaft that supports one or more of the rotary blades and the motors;
a motor control unit that controls rotation of one or more of the motors; and
a plurality of power supply lines that supply electric power to each pair of the motors,
wherein
the battery packs are connected to the respective power supply lines.

9. The electric aircraft according to claim 8, wherein
a plurality of pairs of the rotary blades facing each other are provided, and
wherein the plurality of pairs of the rotary blades are same in number as the plurality of the battery packs.

10. An electric vehicle, comprising:
the battery pack according to claim 6,
a conversion device that receives supply of electric power from the secondary battery device of the battery pack and converts the supplied electric power to driving force of a vehicle; and
a control device that performs information processing relating to vehicle control based on information associated with the secondary battery device.

11. A power supply device, comprising the battery pack according to claim 6, wherein electric power is configured to be supplied to an electronic device connected to the battery pack.

12. An uninterruptible power supply device, comprising the battery pack according to claim 6, wherein electric power is configured to be supplied to an electronic device connected to the battery pack.

* * * * *